(12) United States Patent
Liskow

(10) Patent No.: US 10,653,020 B2
(45) Date of Patent: May 12, 2020

(54) ELECTRONIC MODULE AND METHOD FOR PRODUCING AN ELECTRONIC MODULE

(71) Applicant: Robert Bosch GmbH, Stuttgart (DE)

(72) Inventor: Uwe Liskow, Shanghai (CN)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/481,281

(22) PCT Filed: Jan. 23, 2018

(86) PCT No.: PCT/EP2018/051571
§ 371 (c)(1),
(2) Date: Jul. 26, 2019

(87) PCT Pub. No.: WO2018/153595
PCT Pub. Date: Aug. 30, 2018

(65) Prior Publication Data
US 2020/0045839 A1    Feb. 6, 2020

(30) Foreign Application Priority Data

Feb. 23, 2017  (DE) .......................... 10 2017 202 962

(51) Int. Cl.
*H05K 1/00* (2006.01)
*H05K 5/00* (2006.01)
(Continued)

(52) U.S. Cl.
CPC .......... *H05K 5/0082* (2013.01); *H05K 1/111* (2013.01); *H05K 3/34* (2013.01); *H05K 7/12* (2013.01);
(Continued)

(58) Field of Classification Search
USPC ..................................................... 361/748
See application file for complete search history.

(56) References Cited

U.S. PATENT DOCUMENTS

2016/0186959 A1*  6/2016  Kim .......................... F21V 5/04
                                                    362/311.02
2017/0006711 A1*  1/2017  Liskow ................ H05K 3/3421

FOREIGN PATENT DOCUMENTS

DE  10 2011 088 037 A1  6/2013
DE  10 2015 207 048 A1  10/2016
(Continued)

OTHER PUBLICATIONS

International Search Report corresponding to PCT Application No. PCT/EP2018/051571, dated Apr. 20, 2018 (German and English language document) (5 pages).

*Primary Examiner* — Andargie M Aychillhum
(74) *Attorney, Agent, or Firm* — Maginot, Moore & Beck LLP

(57) ABSTRACT

An electronic module includes a printed circuit board (PCB) element, a base with a first electrically conductive contact element, and an electronic component with a second electrically conductive contact element. The base is fastened on and electrically connected to the PCB element. The electronic component is electrically connected to the base by an electric contact region between the first and second contact elements. A first portion of the first contact element protrudes from the base on a first side of the base facing away from the PCB element. The first portion of the first contact element and/or a second portion of the second contact element has a resilient configuration such that the electronic component is mechanically fastened to the base by a spring force between the first and second contact elements. The electronic module in one embodiment is configured for a transmission controller or an electric vehicle.

13 Claims, 2 Drawing Sheets

(51) Int. Cl.
*H05K 7/12* (2006.01)
*H05K 3/34* (2006.01)
*H05K 1/11* (2006.01)

(52) U.S. Cl.
CPC ............... *H05K 2201/0311* (2013.01); *H05K 2201/1059* (2013.01); *H05K 2201/10151* (2013.01); *H05K 2201/10189* (2013.01)

(56) References Cited

FOREIGN PATENT DOCUMENTS

DE   10 2015 214 311 A1   2/2017
JP        H02-268491 A    11/1990

\* cited by examiner

ELECTRONIC MODULE AND METHOD FOR PRODUCING AN ELECTRONIC MODULE

This application is a 35 U.S.C. § 371 National Stage Application of PCT/EP2018/051571, filed on Jan. 23, 2018, which claims the benefit of priority to Serial No. DE 10 2017 202 962.5, filed on Feb. 23, 2017 in Germany, the disclosures of which are incorporated herein by reference in their entirety.

BACKGROUND

The disclosure relates to an electronic module and method for producing an electronic module.

Electronic components, for example, sensors, large electrical components, and/or plugs, are fastened in electronic modules on the printed circuit board elements, for example, by screws and/or rivet connections or integrated therein. Pins, which are plugged into printed circuit board elements and/or flexible films (so-called plug-through solder contacts), protrude out of the sensors, components, and/or plugs. Alternatively, these pins are welded or soldered on to relaying stamped gratings. The sensor and/or the plug are connected to a central transmission control unit iTCU or a transmission plug by means of the stamped gratings, flexible films, and/or printed circuit boards.

Previously known types of fastening of sensors, components, and/or plugs on printed circuit board elements have typically have the disadvantage that the position of the sensor and/or plug can only be changed by fundamental design changes. However, the change of the position of the electronic components or the sensors and/or plugs, respectively, is generally made more difficult in that the screws and/or rivets for fastening the electronic components require area and volume on the printed circuit board element.

Moreover, electronic components are fastened by means of reflow soldering on the printed circuit board element. Therefore, in the prior art, the sensors and/or plugs have to be designed in such a way that they withstand the high temperatures during the reflow soldering without damage. Large electrical components such as throttle coils may only be reflow soldered to a limited extent because of the high thermal mass (large copper mass).

SUMMARY

Embodiments of the present disclosure can advantageously enable a control module, in which the position of an electronic component or a sensor and/or a plug, respectively, on the printed circuit board element is changeable in a technically simple manner.

According to a first aspect of the disclosure, an electronic module is proposed, in particular for a transmission controller or an electric vehicle, comprising a printed circuit board element, a base having at least one first electrically conductive contact element, wherein the base is fastened on the printed circuit board element and is electrically connected to the printed circuit board element, at least one electronic component, wherein the electronic component comprises at least one second electrically conductive contact element, wherein the electronic component is electrically connected to the base via an electrical contact region between the first contact element and the second contact element, characterized in that a section of the first contact element protrudes out of the base on a first side of the base facing away from the printed circuit board element, wherein the section of the first contact element protruding out of the base is at least partially accommodated in a cavity of the electronic component, wherein the section of the first contact element protruding out of the base and/or a section of the second contact element is formed resilient in such a way that the electronic component is mechanically fastened on the base by means of spring force between the first contact element and the second contact element.

One advantage thereof is that the electronic component can be fastened in a technically simple manner on the printed circuit board element. In addition, the fastening position of the electronic component can be changed in a technically simple manner by changing the fastening position of the base. In addition, the electronic component, in particular a sensor, a large electrical component, and/or a connection plug, can first be fastened by means of the base on the printed circuit board element after a reflow soldering. In this way, the electronic component or the sensor and/or the connection plug, respectively, is not subjected to the high temperatures during the reflow soldering. The electronic component can therefore be produced from a cost-effective material. This reduces the production costs.

According to a second aspect of the disclosure, a method for producing an electronic module is proposed, in particular for a transmission controller or an electric vehicle, wherein the method comprises the following: providing a printed circuit board element having a first side; fastening a base comprising at least one first contact element on the first side of the printed circuit board element and electrically connecting the base to the printed circuit board element, wherein a section of the first contact element protrudes out of the base on a first side of the base facing away from the printed circuit board element; and mechanically fastening and electrically connecting an electronic component using at least one second contact element to the base by means of a spring force between the first contact element and the second contact element, wherein the section of the first contact element is at least partially inserted into a cavity of the electronic component during the mechanical fastening and electrical connection of the electronic component.

This has the advantage that the electronic component is fastened in a technically simple manner on the printed circuit board element. In addition, the fastening position of the electronic component can be changed in a technically simple manner by changing the fastening position of the base. In addition, the electronic component, in particular a sensor and/or connection plug, can be fastened by means of the base on the printed circuit board element only after a reflow soldering. In this way, the electronic component or the sensor and/or the connection plug, respectively, is not subjected to the high temperatures during the reflow soldering. The electronic component can therefore be produced from a cost-effective material. This reduces the production costs.

Ideas for embodiments of the present disclosure can be considered to be based, inter alia, on the concepts and findings described hereafter.

According to one embodiment, the base is fastened on the printed circuit board by soldering and/or press-in pins. In this way, a technically simple mechanical fastening of the base on the printed circuit board element is provided. In addition, the position of the base in relation to the printed circuit board element may be changed in a technically simple and rapid manner.

According to one embodiment, the cavity of the electronic component is filled using a potting compound in such a way that the electrical contact region between the first contact element and the second contact element is covered by the potting compound. One advantage thereof is that the electronic contact region is protected from metal chips, liquid, and the like. In this way, short circuits are reliably prevented.

According to one embodiment, the cavity of the electronic component is filled using a potting compound in such a way that the region enclosed by the electronic component is substantially completely filled using potting compound. One advantage thereof is that the stability of the electronic component is enhanced. Moreover, the electronic contact region is also protected in this way from metal chips, liquid, and the like, whereby short circuits are prevented.

According to one embodiment, a first side of the printed circuit board element is at least partially covered by a potting compound in such a way that an electrical connection point, in particular comprising a solder pad, between the base and the printed circuit board element is covered by the potting compound. One advantage thereof is that the electrical connection point is reliably protected from metal chips, liquid, and the like. Short circuits are prevented in this way.

According to one embodiment, the electronic component has at least one projection for aligning the electronic component in relation to the printed circuit board element, wherein the projection engages in a recess of the printed circuit board element. This has the advantage that the electronic component is aligned in a technically simple manner in relation to the printed circuit board element.

According to one embodiment, the printed circuit board element is arranged on a base plate and the projection extends through a recess of the printed circuit board element and contacts the base plate. One advantage thereof is that the installation height of the electronic component, i.e., the (greatest) distance of the electronic component from the base plate, is independent of the thickness and/or height of the printed circuit board element.

According to one embodiment, the method furthermore comprises the following steps: applying a potting compound to at least partial regions of the first side of the printed circuit board element in such a way that an electrical connection point between the base and the printed circuit board element is covered by the potting compound; and curing the potting compound. One advantage thereof is that the electrical connection point is reliably protected from metal chips, liquid, and the like. Short circuits are prevented in this way.

According to one embodiment, the method furthermore comprises the following steps: introducing a potting compound into the cavity of the electronic component in such a way that an electrical contact region between the first contact element and the second contact element is covered by the potting compound; and curing the potting compound. One advantage thereof is that the electronic contact region is protected from metal chips, liquid, and the like. Short circuits are reliably prevented in this way.

It is to be noted that some of the possible features and advantages of the disclosure are described herein with reference to different embodiments of the electronic module and/or the method for producing an electronic module. A person skilled in the art recognizes that the features can be combined, adapted, or exchanged in a suitable manner to arrive at further embodiments of the disclosure.

BRIEF DESCRIPTION OF THE DRAWINGS

Embodiments of the disclosure are described hereafter with reference to the appended drawings, wherein neither the drawings nor the description are to be interpreted as restricting the disclosure.

DETAILED DESCRIPTION

Figure 2:
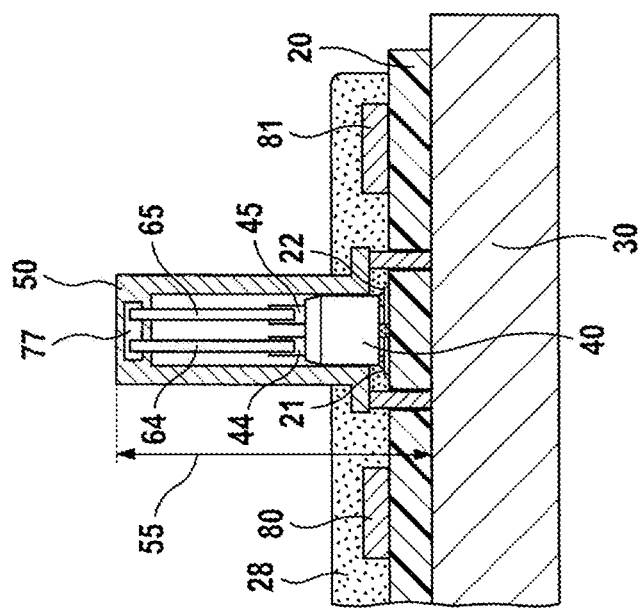
FIG. 2 shows a cross-sectional view of the electronic module from FIG. 1 rotated by 90° around a vertical axis.
Figure 1:
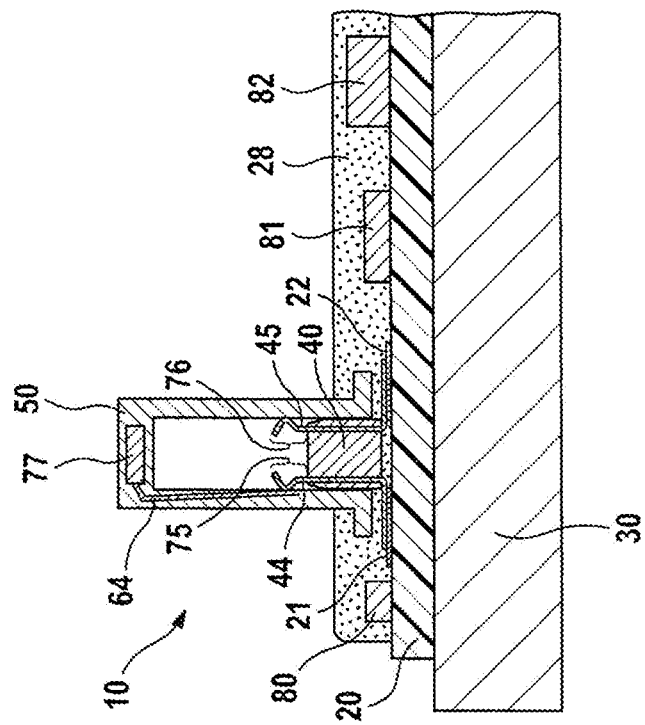
FIG. 1 shows a cross-sectional view of a first embodiment of the electronic module according to the disclosure.

FIG. 1 shows a cross-sectional view of a first embodiment of the electronic module 10 according to the disclosure. FIG. 2 shows a cross-sectional view of the electronic module 10 from FIG. 1 rotated by 90° around a vertical axis.

The electronic module 10 can be an electronic module of a transmission controller or can be designed for the control of an electric drive in a vehicle (for example, in an electric vehicle). The transmission controller can be the transmission controller of a motor vehicle, for example, of a passenger automobile or a truck.

The electronic module 10 comprises multiple electronic components. In addition to typical integrated circuits as electronic components (which are arranged immediately or directly on the printed circuit board element 20), a sensor device 50 is arranged on the printed circuit board element 20. Only one sensor device 50 is referred to hereafter. Alternatively or additionally to a sensor device 50, a connection plug or a terminal is also conceivable.

The sensor device 50 is fastened on a base 40. The base 40 is fastened on the printed circuit board element 20. The sensor device 50 is electrically connected to the printed circuit board element 20 via the base 40.

The base 40 has two first contact elements 44, 45. The two first contact elements 44, 45 are connected via solder pads 21, 22 to the printed circuit board element 20. The base 40 is electrically and mechanically connected and/or soldered to the printed circuit board element 20 via this connection. It is also conceivable that the base 40 is electrically and mechanically connected via press-in pins to the printed circuit board element 20.

The two first contact elements 44, 45 can be formed continuously and/or in one piece as shown in FIG. 1. Alternatively, it is also conceivable that the two first contact elements 44, 45 are formed in two or multiple parts. An electrical connection has to be provided between the multiple parts of the one first contact element 44, 45, so that the sensor device 50 is electrically connected to the printed circuit board element 20.

A part or a section 75, 76 of the first contact elements 44, 45 protrudes out of the base 40 on the side of the base 40 facing away from the printed circuit board element 20 (this is the upper side of the base 40 in FIG. 1 or FIG. 2). This part or section 75, 76 of the first contact element 44, 45 is formed in a resilient manner. This part or section 75, 76 of the first contact element 44, 45 is movable or bendable reversibly to the right and left in FIG. 1 or FIG. 2. The first contact element 44, 45 can be a wire and/or a conductive plate in each case.

The sensor device 50 has a sensor 77. The sensor 77 is enclosed in the housing of the sensor device 50. The sensor 77 is electrically connected to two second contact elements 64, 65. These lead from the sensor 77 in the direction of the printed circuit board element 20. The second contact elements 64, 65 extend partially inside the housing of the sensor device 50. The sensor device 50 or the housing of the sensor device 50 encloses a cavity. A section or part of each of the second contact elements 64, 65 protrudes into this cavity.

This section or part of the second contact elements 64, 65 can be formed so as to be rigid and can be connected via a spring force to each of the first contact elements 44, 45. It is also conceivable that the second contact elements 64, 65 are formed so as to be resilient and the part of the first contact elements 44, 45 protruding upward out of the base 40 is formed so as to be rigid. A mechanical and electrical connection between the first contact elements 44, 45 and the second contact elements 64, 65 can also be formed in this case by means of spring force.

It is also conceivable that both the first contact elements 44, 45 and also the second contact elements 64, 65 are formed so as to be resilient.

An electrical connection is established between the sensor 77 and the printed circuit board element 20 by the electrical connection between the first contact elements 44, 45 and the second contact elements 64, 65.

The number of the first contact elements 44, 45 and/or the second contact elements 64, 65 can also be one, three, four, or more than four.

The side of the printed circuit board element 20 on which the base 40 and the further electronic components 80-82 are arranged is partially or completely provided with a potting compound 28. The potting compound 28 covers the further electronic components 80-82 in addition to the sensor device 50, the solder pads 21, 22, a (lower) part of the base 40, and a (lower) part of the sensor device 50. In this way, the sensor device 50 is additionally fastened on the printed circuit board element 20.

The potting material protects the further electronic components 80-82 and the electrical connection between the base 40 and the printed circuit board element 20.

The printed circuit board element 20 is arranged on a base plate 30. The base plate 30 can be part of the housing of a transmission, in particular for a motor vehicle. The base plate 30 can also be designed to dissipate heat from the printed circuit board element 20.

The sensor device 50 has two projections, which are arranged in recesses 51 of the printed circuit board element 20. This is used to align the sensor device 50 in relation to the printed circuit board element 20. The installation height 55 of the electronic component or the sensor device 50 can also be set by means of the projections. The installation height 55 is the greatest distance of the sensor device 50 and the base plate 30. This corresponds to the distance between the uppermost part of the sensor device 50 in FIG. 2 from the base plate 30 or from the side of the base plate 30 facing toward the sensor device 50. The side of the base plate 30 facing toward the sensor device 50 is the upper side of the base plate 30 in FIG. 1 and in FIG. 2.

The sensor device 50 does not directly or immediately touch the printed circuit board element 20. The sensor device 50 also does not directly or immediately touch the solder pads 21, 22. A distance, which is filled using potting material 28, is provided between the sensor device 50 and the printed circuit board element 20 or the solder pads 21, 22, respectively. However, it is also conceivable that the sensor device 50 contacts the printed circuit board element 20 and/or the solder pads 21, 22, so that a distance is not provided in either case.

In FIG. 2, the projections extend through the printed circuit board element 20 and rest on the base plate 30. In this way, the installation height 55 of the sensor device 50 can be set independently of the thickness of the printed circuit board element 20. The thickness of the printed circuit board element 20 extends from bottom to top in FIG. 1 and FIG. 2. FIG. 2 shows a view of the first contact elements 44, 45 and the second contact elements 64, 65 rotated in relation to FIG. 1 by 90° around a vertically extending axis. It can be seen clearly in FIG. 2 how the resiliently formed section 75, 76 of the first contact elements 44, 45 presses in each case against the second contact elements 64, 65. The resiliently formed sections 75, 76 in FIG. 2 press in a direction which extends out of the plane of the drawing of FIG. 2.

Figure 3:
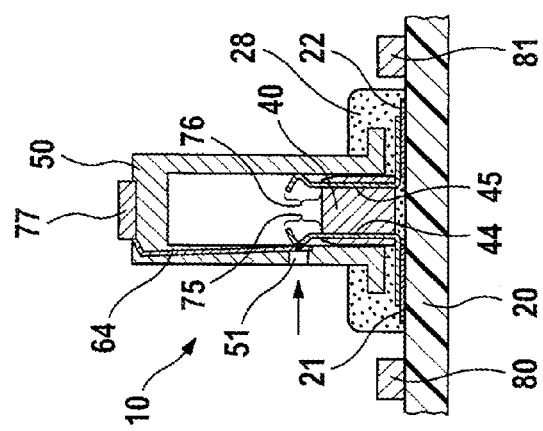
FIG. 3 shows a cross-sectional view of a second embodiment of the electronic module according to the disclosure.

FIG. 3 shows a cross-sectional view of a second embodiment of the electronic module 10 according to the disclosure. The embodiment shown in FIG. 3 essentially differs from the embodiment shown in FIG. 1 or FIG. 2 in that the first contact elements 44, 45 are additionally welded via a recess 51 in the housing of the sensor device 50 to the second contact elements 64, 65 in the electrical contact region by means of lasers. This enhances the mechanical strength. Moreover, one difference is that the further electronic components 80-82 are not covered by the potting material.

Figure 4:
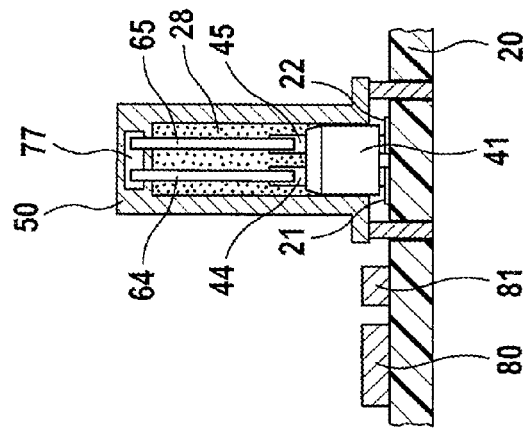
FIG. 4 shows a cross-sectional view of a third embodiment of the electronic module according to the disclosure.

FIG. 4 shows a cross-sectional view of a third embodiment of the electronic module 10 according to the disclosure. The potting compound 28 is introduced here into the cavity above the base 40. The potting compound 28 does not cover any part of the printed circuit board element 20. The electrical contact region or the electrical contact regions between the first contact elements 44, 45 and the second contact element 64, 65 is or are covered by the potting material.

Figure 5:
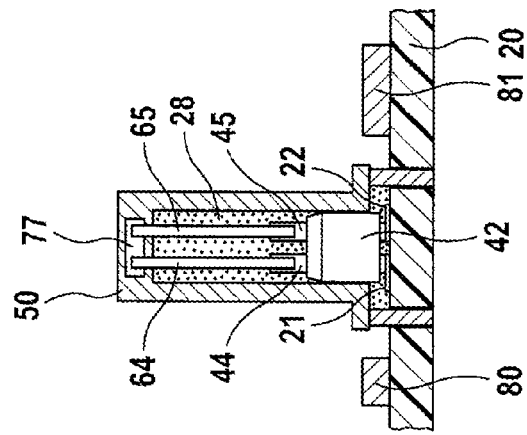
FIG. 5 shows a cross-sectional view of a fourth embodiment of the electronic module according to the disclosure The figures are solely schematic and are not to scale. Identical reference signs identify identical or identically-acting features in the figures.

FIG. 5 shows a cross-sectional view of a fourth embodiment of the electronic module 10 according to the disclosure. The potting material fills up the cavity enclosed completely by the sensor device 50 here. The electrical contact region or the electrical contact regions between the first contact elements 44, 45 and the second contact element 64, 65 is or are covered by the potting material.

Finally, it is to be noted that terms such as "having", "comprising", etc. do not exclude other elements or steps and terms such as "a" or "one" do not exclude a plurality. Reference signs in the claims are not to be considered to be a restriction.

The invention claimed is:

1. An electronic module, comprising:
   a printed circuit board element;
   a base having at least one first electrically conductive contact element, the base fastened on and electrically connected to the printed circuit board element; and
   at least one electronic component that includes at least one second electrically conductive contact element, the electronic component electrically connected to the base via an electrical contact region between the first contact element and the second contact element,
   wherein a first section of the first contact element protrudes out of the base on a first side of the base facing away from the printed circuit board element, the first section at least partially accommodated in a cavity of the electronic component, and
   wherein one or more of the first section of the first contact element and a second section of the second contact element has a resilient configuration such that the electronic component is mechanically fastened on the base by a spring force between the first contact element and the second contact element.

2. The electronic module as claimed in claim 1, wherein the base is fastened on the printed circuit board element by one or more of soldering and press-in pins.

3. The electronic module as claimed in claim 1, wherein the cavity of the electronic component is filled using a potting compound such that the electrical contact region between the first contact element and the second contact element is filled by the potting compound.

4. The electronic module as claimed in claim 1, wherein the cavity of the electronic component is filled using a potting compound such that the region enclosed by the electronic component is substantially completely filled using potting compound.

5. The electronic module as claimed in claim 1, wherein a first side of the printed circuit board element is at least partially covered by a potting compound such that an electrical connection point between the base and the printed circuit board element is covered by the potting compound.

6. The electronic module as claimed in claim 5, wherein the electronic connection point includes a solder pad.

7. The electronic module as claimed in claim 1, wherein the electronic component has at least one projection configured to align the electronic component in relation to the printed circuit board element, and wherein the projection engages in a recess of the printed circuit board element.

8. The electronic module as claimed in claim 7, wherein the printed circuit board element is arranged on a base plate, and wherein the projection engages through a recess of the printed circuit board element and contacts the base plate.

9. The electronic module as claimed in claim 1, wherein the electronic module is configured for a transmission controller or an electric vehicle.

10. A method for producing an electronic module, comprising:

fastening on a first side of a printed circuit board element a base that includes at least one first contact element and electrically connecting the base to the printed circuit board element, the first contact element having a section that protrudes out of the base on a first side of the base facing away from the printed circuit board element; and mechanically fastening and electrically connecting an electronic component having at least one second contact element to the base by a spring force between the first contact element and the second contact element, wherein the section of the first contact element is at least partially inserted into a cavity of the electronic component during the mechanical fastening and electrical connecting of the electronic component.

11. The method as claimed in claim 10, further comprising:

applying a potting compound to at least partial regions of the first side of the printed circuit board element such that an electrical connection point between the base and the printed circuit board element is covered by the potting compound; and curing the potting compound.

12. The method as claimed in claim 10, further comprising:

introducing a potting compound into the cavity of the electronic component such that an electrical contact region between the first contact element and the second contact element is covered by the potting compound; and curing the potting compound.

13. The method as claimed in claim 10, wherein the electronic module is configured for a transmission controller or an electric vehicle.

* * * * *